United States Patent
Murahari et al.

(10) Patent No.: US 11,709,188 B2
(45) Date of Patent: Jul. 25, 2023

(54) ENERGY MONITORING DEVICE

(71) Applicant: EATON INTELLIGENT POWER LIMITED, Dublin (IE)

(72) Inventors: Saivaraprasad Murahari, Peachtree City, GA (US); Nilesh Ankush Kadam, Pune (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 168 days.

(21) Appl. No.: 17/388,556

(22) Filed: Jul. 29, 2021

(65) Prior Publication Data

US 2022/0043036 A1 Feb. 10, 2022

Related U.S. Application Data

(60) Provisional application No. 63/063,697, filed on Aug. 10, 2020.

(51) Int. Cl.
*G01R 19/25* (2006.01)
*G01R 19/32* (2006.01)

(52) U.S. Cl.
CPC ..... *G01R 19/2506* (2013.01); *G01R 19/2513* (2013.01); *G01R 19/32* (2013.01)

(58) Field of Classification Search
CPC .... G01R 19/00; G01R 19/25; G01R 19/2506; G01R 19/2513; G01R 19/32; G01R 21/14; G01R 21/06; G01R 31/14; G01R 15/12; G01R 15/146

See application file for complete search history.

(56) References Cited

U.S. PATENT DOCUMENTS

| | | | |
|---|---|---|---|
| 2009/0213519 A1* | 8/2009 | Bedingfield | H01F 7/1844 361/160 |
| 2012/0112728 A1* | 5/2012 | Bodo | G01R 15/142 323/311 |
| 2016/0169945 A1* | 6/2016 | Mauder | H01H 1/0015 324/126 |
| 2016/0268079 A1* | 9/2016 | Kim | H01H 47/001 |

FOREIGN PATENT DOCUMENTS

WO WO-2020183634 A1 * 9/2020 ............. H01R 43/16

* cited by examiner

*Primary Examiner* — Son T Le
(74) *Attorney, Agent, or Firm* — Eckert Seamans Cherin & Mellott, LLC

(57) ABSTRACT

An energy monitoring device includes a power supply circuit electrically coupled to a power source via a hot conductor and a load via a load conductor; a relay circuit including a relay and a relay driver circuit, where the relay includes a plurality of coils and the relay contact electrically coupled to the hot conductor and the load conductor; a sensing circuit including a hot voltage sensor and a load voltage sensor; and a controller electrically coupled to the power supply circuit, the relay driver circuit, and the sensing circuit, and structured to receive a hot voltage from the hot voltage sensor and a load voltage from the load voltage sensor, and determine a load current based at least in part on a relay contact resistance of the relay contact and a delta between the hot voltage and the load voltage.

20 Claims, 10 Drawing Sheets

ENERGY MONITORING DEVICE

CROSS-REFERENCE TO RELATED APPLICATION

This patent application claims the priority benefit under 35 U.S.C. § 119(e) of U.S. Provisional Application No. 63/063,697, filed on Aug. 10, 2020, the contents of which are herein incorporated by reference.

BACKGROUND OF THE INVENTION

Field of the Invention

The disclosed concept relates generally to energy monitoring device, and in particular, to energy monitoring device using a relay contact resistance of a relay of the energy monitoring device for determining a load current.

Background Information

As automation of home or office appliances has dramatically increased, so has a demand for energy monitoring of a branch of power supply devices, e.g., one or more circuit breakers that power the home or office appliances. Conventionally, energy monitoring of a branch of the breakers requires measuring load voltage and load current. While measuring voltage is straightforward, measuring current is more complex in that it requires measuring a current shunt that is added to the breaker(s). Typically, a current shunt is bulky and needs a large shunt resistor and a circuit to measure current through that shunt resistor. As such, conventional energy monitoring devices may require additional costs associated with having to install the current shunt thereto. Further, conventional energy monitoring devices may face additional heat that is dissipated by the shunt resistor, thereby decreasing efficiency or accuracy of the current reading.

A simple mechanism for energy monitoring without having to incur additional expenses or encounter unnecessary heat dissipation associated with adding a current shunt may be helpful.

There is room for improvement in energy monitoring devices.

SUMMARY OF THE INVENTION

These needs, and others, are met by at least one embodiment of the disclosed concept in which an energy monitoring device includes a power supply circuit electrically coupled to a power source via a hot conductor and a load via a load conductor; a relay circuit including a relay and a relay driver circuit electrically coupled to the relay and configured to drive the relay, where the relay includes a relay contact and a plurality of coils including a first coil and a second coil, and the relay contact is electrically coupled to the hot conductor and the load conductor; a sensing circuit including a hot voltage sensor electrically coupled to the power source and a load voltage sensor electrically coupled to the load conductor; and a controller including an analog to digital converter and electrically coupled to the power supply circuit, the relay driver circuit, and the sensing circuit, where the controller is structured to receive a hot voltage from the hot voltage sensor and a load voltage from the load voltage sensor, and determine a load current based at least in part on a relay contact resistance of the relay contact and a delta between the load voltage and the hot voltage.

In accordance with an example embodiment of the disclosed concept, an energy monitoring device includes a power supply circuit electrically coupled to a power source via a hot conductor and a load via a load conductor; a relay circuit comprising a relay and a relay driver circuit electrically coupled to the relay and configured to drive the relay, wherein the relay comprises a relay contact and a plurality of coils, and the relay contact is electrically coupled to the hot conductor and the load conductor; a sensing circuit comprising a differential voltage amplifier circuit, wherein the differential voltage amplifier circuit comprises a differential operational amplifier (OPAMP), one input terminal of the OPAM is coupled to the power source and structured to receive hot voltage sensed at the hot conductor, the other input terminal of the OPAMP is coupled to the load and structured to receive load voltage sensed at the load conductor, and the output terminal of the OPAMP is structured to provide a voltage output representative of a delta between the hot voltage and the load voltage; and a controller comprising an analog to digital converter, and electrically coupled to the power supply circuit, the relay driver circuit, and the sensing circuit, wherein the controller is structured to receive the delta between the hot voltage and the load voltage from the differential voltage amplifier circuit, and determine a load current based at least in part on a relay contact resistance of the relay contact and the delta.

In accordance with an example embodiment of the disclosed concept, a method for energy monitoring includes: measuring, by a sensing circuit of an energy monitoring device, a hot voltage and a load voltage of an energy monitoring device; transmitting, by the sensing circuit, the measured hot voltage and the measured load voltage to a controller of the energy monitoring device; determining, by the controller, a delta between the hot voltage and the load voltage; retrieving, by the controller, a relay contact resistance from memory of the controller; and determining a load current based on the delta and the relay contact resistance.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
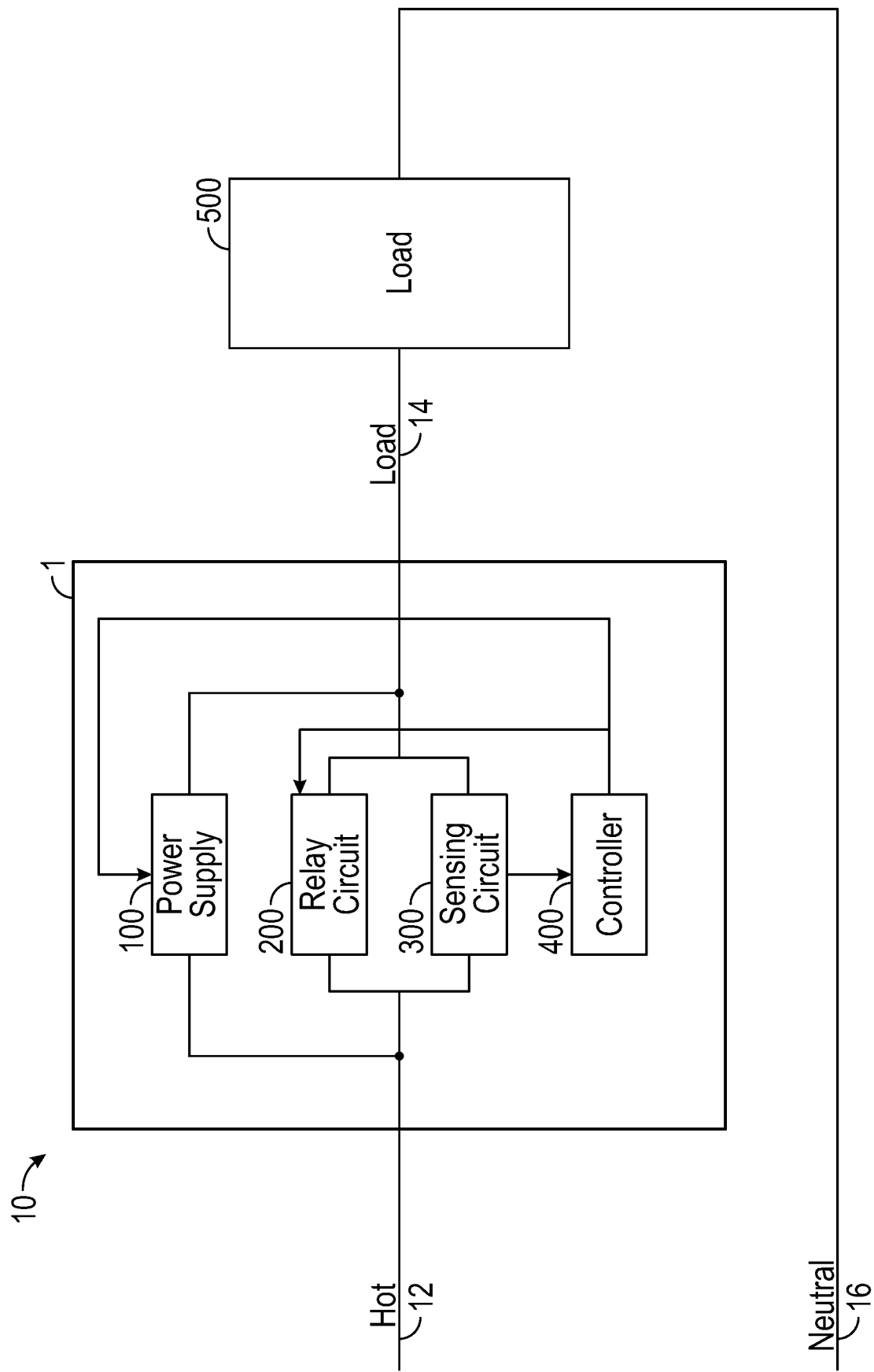
FIG. 1 is a schematic diagram of an energy monitoring system in accordance with an example embodiment of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, the term "number" shall mean one or an integer greater than one (i.e., a plurality).

Energy monitoring for e.g., a circuit breaker or a branch of a plurality of circuit breakers, a switch, a receptacle, etc., requires measuring load voltage and load current. However, measuring current requires a use of current shunt including a shunt resistor and circuitry to measure voltage across the shunt resistor when current passes. In addition to the additional costs, the current shunt may render energy monitoring of the circuit breaker(s), switch, receptacle, etc. inefficient because of the additional heat dissipated by the shunt resistor.

Example embodiments of the disclosed concept address these issues. For example, the energy monitoring device in accordance with the present disclosure monitors energy consumed at a branch of breakers, a switch, a receptacle, or any other relay-based wiring devices by using a component of the energy monitoring device, not a current shunt added to the energy monitoring device. That is, the energy monitoring device, e.g., one or more breakers, a switch, a receptacle, or any other relay-based wiring devices, may use contact relay resistance of a contact relay of the energy monitoring device itself—without additional current shunt installed—to measure load current. As such, the energy monitoring device in accordance with the present disclosure not only reduces manufacturing costs associated with installing the current shunt, but also prevents unnecessary heating introduced in the form of a shunt resistor. Thus, the energy monitoring device in accordance with the present disclosure provides an inexpensive and effective energy monitoring mechanism in relay-based wiring devices at home, office, or any other environment using devices including relays controlled manually or via wireless technologies (e.g., Wi-Fi, RF, near field communications technologies, etc.).

FIG. 1 is a schematic diagram of an energy monitoring system 10 including an energy monitoring device 1 in accordance with an example embodiment of the disclosed concept. The energy monitoring system 10 includes a HOT conductor 12, a LOAD conductor 14, and a NEUTRAL conductor 16. The HOT conductor 12 may be electrically connected to a power source such as 120 $V_{AC}$ residential, commercial or other suitable power source. The LOAD conductor 14 may be electrically connected to a load 500. The NEUTRAL conductor 16 may be electrically coupled to the load 500 to complete the AC power circuit. The load 500 may be any home or office appliances, e.g., lights, smart TV, smart refrigerator, music equipment, etc.

The energy monitoring device 1 may be one or more breakers, a switch, a receptacle, or any other relay-based wiring devices and include a relay circuit 200 and may be any relay-based wired devices at home, office, or any other environment. The relay-based wired devices may include relays controlled manually or via wireless technologies (e.g., Wi-Fi, RF, near field communications technologies, etc.).

The energy monitoring device 1 is structured to monitor and sense various voltages and back calculate load current using relay contact resistance of the relay circuit 200. The energy monitoring device 1 includes a power supply circuit 100, the relay circuit 200, sensing circuit 300, and a controller 400. The power supply circuit 100 is structured to supply power to the controller 400, which controls the energy monitoring device 1 during the operations of the energy monitoring device 1. For example, the power supply circuit 100 receives AC voltage (e.g., 110V, 120V, 270V, etc.) from a power source, performs voltage division so as to provide low voltage sufficient to power the controller 400. For example, upon powering on of the energy monitoring device 1, the power supply circuit 100 provides input voltage (e.g., 3.3V, 5V, etc.) to the controller 400, which in turn activates and controls the relay circuit 200, and the sensing circuit 300. The relay circuit 200 may include a relay and a relay driver circuit, discussed in detail with reference to FIGS. 2 and 3. The sensing circuit 300 may include sensors for detecting zero crossing or various voltages, e.g., line/hot voltage, load voltage, or voltage from a temperature sensor, and is structured to transmit respective signals for the zero crossing and voltages to the controller 400.

The controller 400 is structured to receive power from the power supply 100, and control the operation of the energy monitoring device 1 after the power-on. Upon powering on, the controller 400 receives input voltage, e.g., 3.3V, from the power supply 100 and starts to operate. For example, the controller 400 may activate the sensing circuit 300 to detect zero crossing or various voltages, e.g., hot voltage, load voltage, etc. The controller 400 may then receive respective signals for the detected zero crossing or voltages from the sensing circuit 300 and calculate load current using a relay contact resistance of the relay circuit 200 retrieved from memory and a delta between a measured hot voltage and a measured load voltage.

The controller 400 may include a processor and a memory. The processor may be, for example and without limitation, a microprocessor, a microcontroller, or some other suitable processing device or circuitry, that interfaces with the memory. The memory can be any of one or more of a variety of types of internal and/or external storage media such as, without limitation, RAM, ROM, EPROM(s), EEPROM(s), FLASH, and the like that provide a storage register, i.e., a machine readable medium, for data storage such as in the fashion of an internal storage area of a computer, and can be volatile memory or nonvolatile memory. At manufacturing, the controller 400 is programmed and calibrated so that it can obtain accurate measurements. The memory of controller 400 may include a look-up table which has a value of relay contact resistance adjusted in accordance with an instant ambient temperature. For example, the look-up table may include relay contact resistance value at 30° C. (e.g., 1 mΩ), at 35° C. (e.g., 1.1 mΩ), etc. Further, the controller 400 may average the relay contact resistance by covering a wide range of currents applied. For example, the controller 400 may pass a plurality of current including a known low current, e.g., 1 Amp, and a known high current, e.g., 5 or 10 Amp, and measure respective hot voltages and load voltages across the relay contact at these currents. Then, the controller 400 determines respective deltas between the measured hot voltages and load voltages, and calculates respective relay contact resistances based on respective deltas and known currents. The controller 400 then averages the calculated relay contact resistance and processes the average relay contact resistance. The controller 400 then stores the average relay contact resistance in the memory. Then, the energy monitoring device (e.g., one or more breakers, switches, receptacles, or any other relay-based wiring devices) 1 is installed in a home, office, or any other environments using power system. Thus, the controller 400 in accordance with the present disclosure may provide accurate measurements of voltages, currents and relay contact resistance, covering a wide range of currents and temperature variations.

Figure 2:
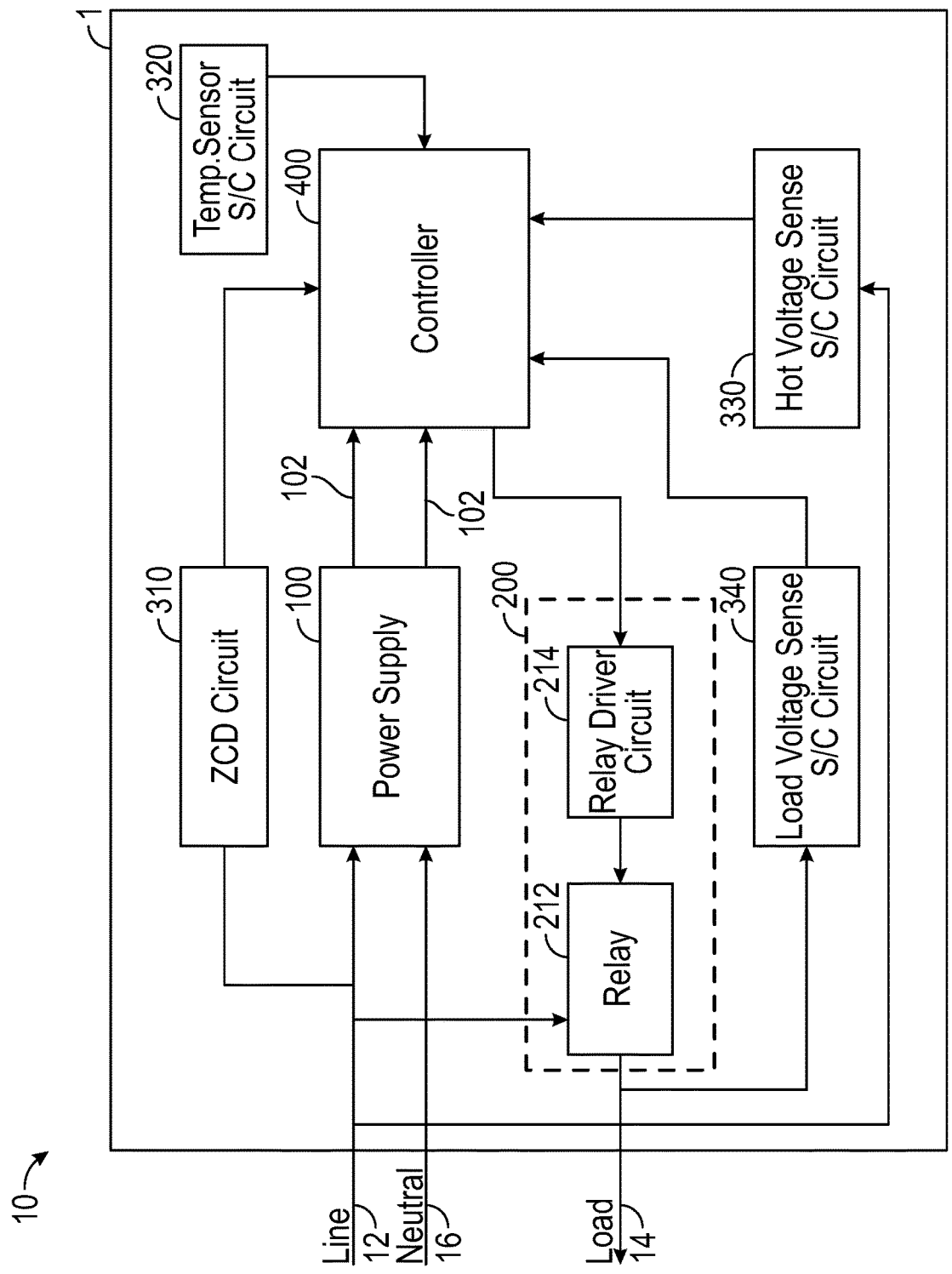
FIG. 2 is a schematic diagram of an energy monitoring system shown in more detail in accordance with an example embodiment of the disclosed concept.

FIG. 2 is a schematic diagram of the energy monitoring system 10 shown in more detail in accordance with an example embodiment of the disclosed concept. In the example embodiment shown in FIG. 2, the power supply circuit 100 is electrically coupled to the HOT conductor 12 and the LOAD conductor 14, and has a power supply output 102. In some example embodiments, one or more DC voltages are output at the power supply output 102. Any suitable voltage may be output at the power supply output 102. In some example embodiments of the disclosed concept, 3.3 V is output at the power supply output 102.

The sensing circuit 300 may include a zero crossing detector (ZCD) circuit 310, a hot voltage sense signal conditioning circuit 330, and a load voltage sense signal conditioning circuit 340. The ZCD circuit 310 is structured to detect current crossing at near zero as the sine signal repeatedly goes up to its peak current and down to zero current. Upon detecting such crossing, the ZCD circuit 310 triggers a relay contact of the relay 212 to close or open. This is because when the current is high, e.g., at its peak current, the relay contact may experience much arcing. By triggering the relay contact to close or open at near zero current, the arcing in the relay contact may be avoided or reduced, thereby increasing the life span of the relay 212. The ZCD circuit 310 triggers the closing and opening of the relay contact by sending a signal to the controller 400, which in turn activates the relay driver circuit 214 to close or open the relay contact of the relay 412 when the AC voltage is near zero.

The hot voltage sense signal conditioning circuit 330 is structured to measure the voltage at the HOT conductor 12 and transmit a hot voltage signal to the controller 300. The hot voltage may be 110V, 120V, 270V, etc. The load voltage sense signal conditioning circuit 240 is structured to measure the voltage at the LOAD conductor 14 and transmit a load voltage signal to the controller 400. The controller 400 then determines the delta of the hot voltage and the load voltage, where the delta is the voltage drop across the relay contact. Finally, the controller 400 determines the load current based on the delta and the relay contact resistance.

Figure 3:
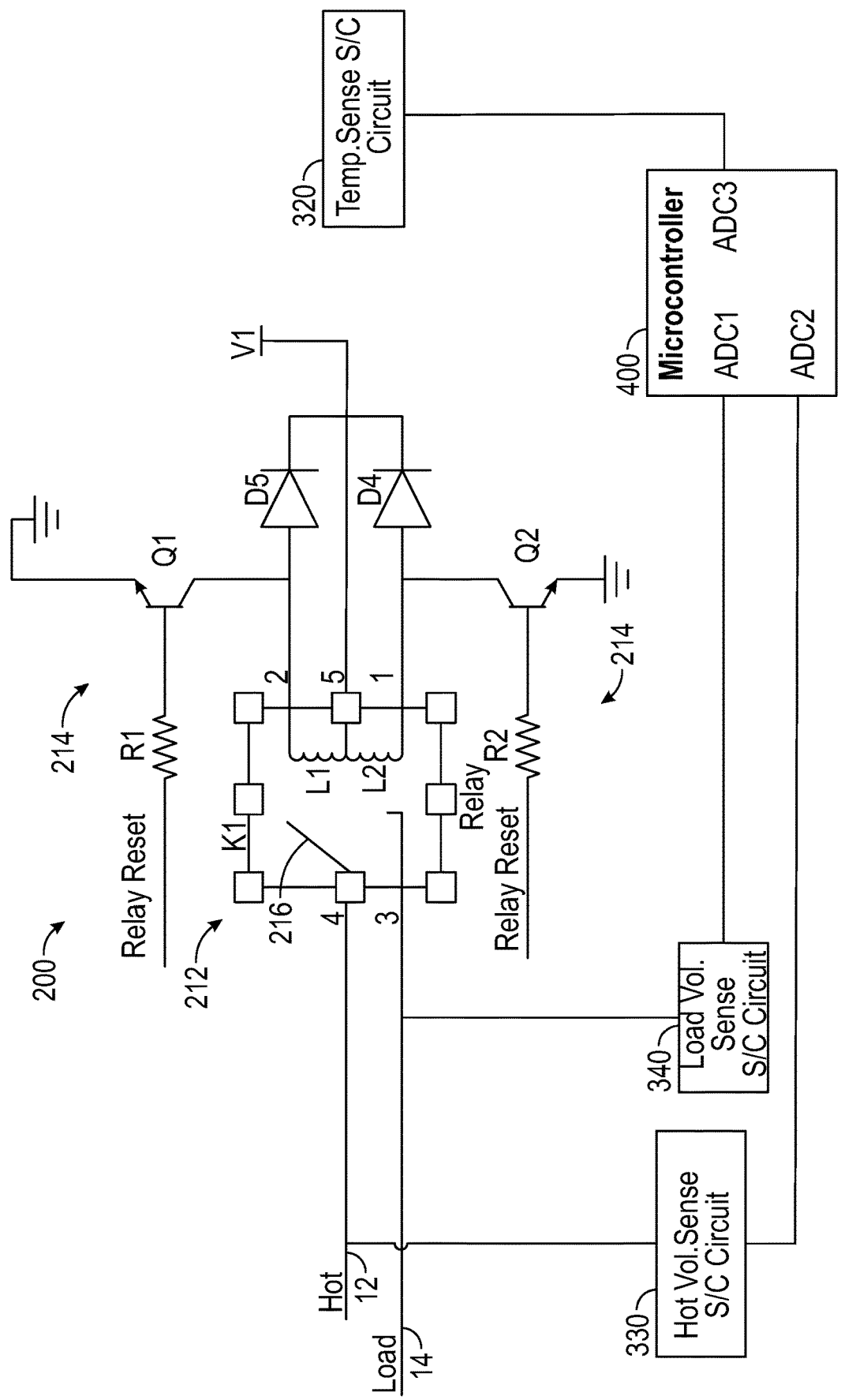
FIG. 3 is a schematic diagram of relay circuit of an energy monitoring device accordance with an example embodiment of the disclosed concept.

In some cases, a temperature sense signal conditioning circuit 320 may be included in the energy monitoring device 1. The temperature sense signal conditioning circuit 320 is structured to transmit a voltage signal to the controller 400 (e.g., a pin ADC 3 as shown in FIG. 3), which in turn determines the ambient temperature in accordance with a formula preconfigured in the memory. That is, based on the ADC 3 input, the controller 400 calculates the instant ambient temperature according to the formula. For example, if the voltage is 1.2 V, the controller 400 may determine the ambient temperature is 25° C. in accordance with the formula. If the measured voltage is 1.5V, the controller 400 may determine the ambient temperature is 30° C. The controller 400 then uses the ambient temperature in obtaining the relay contact resistance adjusted for the temperature. That is, the controller 400 may recalculate relay contact resistance in accordance with an equation applying a temperature based correction factor as shown in Equation 1 below:

$$RC(T) = RC * [1 + \alpha(T - T_{REF})] \quad \text{Equation 1}$$

where RC is relay contact resistance at reference temperature $T_{REF}$ (e.g., 20° C.), T is an instant ambient temperature calculated as per ADC 3, RC(T) is an adjusted relay contact resistance based on the calculated ambient temperature T, $\alpha$ is a temperature coefficient of relay contact resistance (e.g., $\alpha$ may be 3819 for silver), and $[1+\alpha(T-T_{REF})]$ is a temperature based correction factor. For example, if the ambient temperature is 30° C., then the controller 400 may recalculate relay contact resistance RC to adjust for the instant ambient temperature T in accordance with Equation 1 and obtain the adjusted relay contact resistance RC(T). In some examples, the controller 400 may refer to a look-up table which includes recalculated relay contact resistance RC(T) adjusted for a series of ambient temperatures and determine the adjusted relay contact resistance RC(T). Finally, the controller 400 may measure the load current based on the delta and the adjusted relay contact resistance RC(T).

FIG. 3 is a schematic diagram of a relay circuit 200 of an energy monitoring system 10 in accordance with an example embodiment of the disclosed concept. The relay circuit 200 includes a relay 212 and a relay driver circuit 214. The relay 212 includes a relay contact 216 and two coils L1, L2. The relay 212 is structured to close a relay contact 216 when the coil L1 is energized. In some cases, the relay driving circuit 214 may be a latch and hold circuit, where the relay contact 216 closes when switch Q1 is closed and the coil L1 is energized by the output voltage of the power supply circuit 100 flowing via the closed switch Q1, or the relay contact 216 opens when switch Q2 is closed and the coil L2 is energized by the output voltage via the closed switch Q2. For example, switch Q1 closes when it receives a voltage pulse (e.g., 3.3V, 5V, etc.) from the power supply circuit 100 while the switch Q2 remains open. The voltage is then applied to the coil L1 and the coil L1 becomes energized. The energized coil L1 then triggers the relay contact 216 to close. In another example, switch Q2 closes when it receives a voltage pulse from the power supply circuit 100 while switch Q1 is open. The voltage is then applied to the coil L2 and the coil L2 becomes energized. The energized coil L2 then triggers the relay contact 216 to open. In some cases, the relay driving circuit 214 may be a non-latching circuit, and thus, the voltage is continuously applied to switch Q1, which remains closed at all time. Switches Q1, Q2 may be a bipolar junction transistor, an IGBT, a MOSFET, or any other device capable of performing a switch function.

When the relay contact 216 is closed, the hot voltage sense signal conditioning circuit 330 measures the hot voltage at the HOT conductor 12 and transmits a signal representative of the measured hot voltage to a pin ADC 2 of the controller 400. The load voltage sense signal conditioning circuit 340 also measures the load voltage at the LOAD conductor 14 and transmits a signal representative of the measured voltage to a pin ADC 1 of the controller 400. The analog to digital converter within the controller 400 then converts the signals, which are in analog form, into digital bits. The controller 400 then determines a delta by subtracting the measured load voltage from the measured hot voltage. Further, the temperature sense signal conditioning circuit 320, if included in the energy monitoring device 1, may also transmit a voltage signal to a pin ADC 3 of the controller 400. The controller 400 then determines the ambient temperature based on the voltage signal in accordance with, e.g., a formula stored in the memory. The controller 400 next determines the relay contact resistance RC(T) adjusted for the ambient temperature T in accordance with an equation, e.g., Equation 1, preconfigured in the memory. Finally, the controller 400 calculates the load current based on the delta and the adjusted relay contact resistance RC(T).

Figure 4:
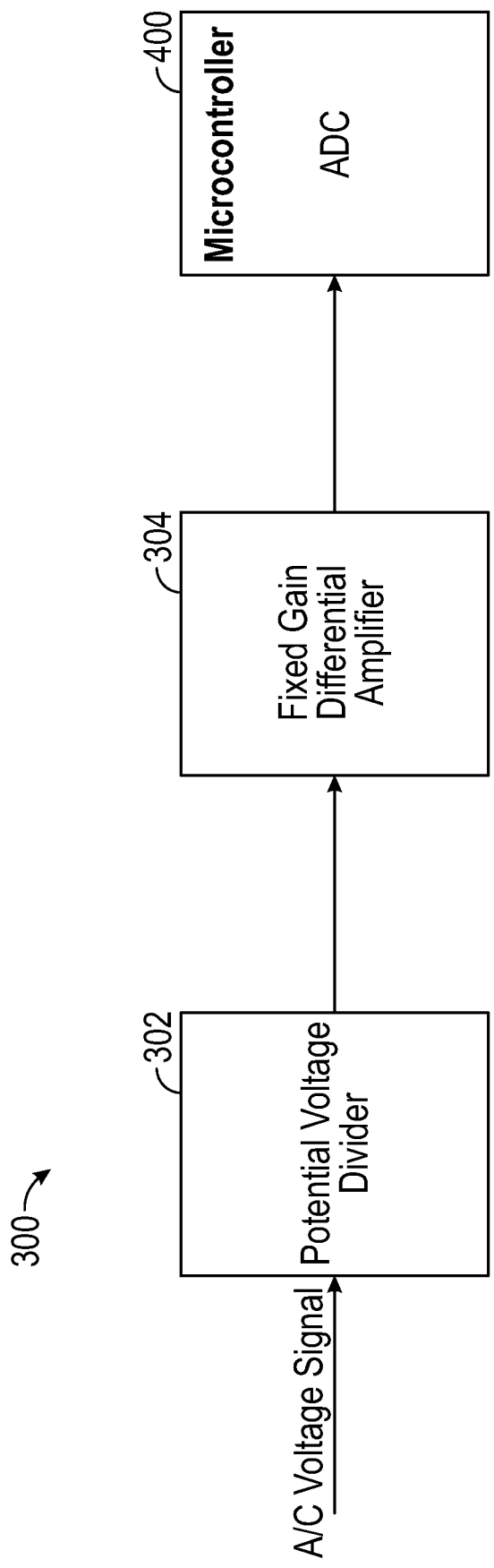
FIG. 4 is a block diagram of an example sensing circuit of an energy monitoring device in accordance with an example embodiment of the disclosed concept.
Figure 5:
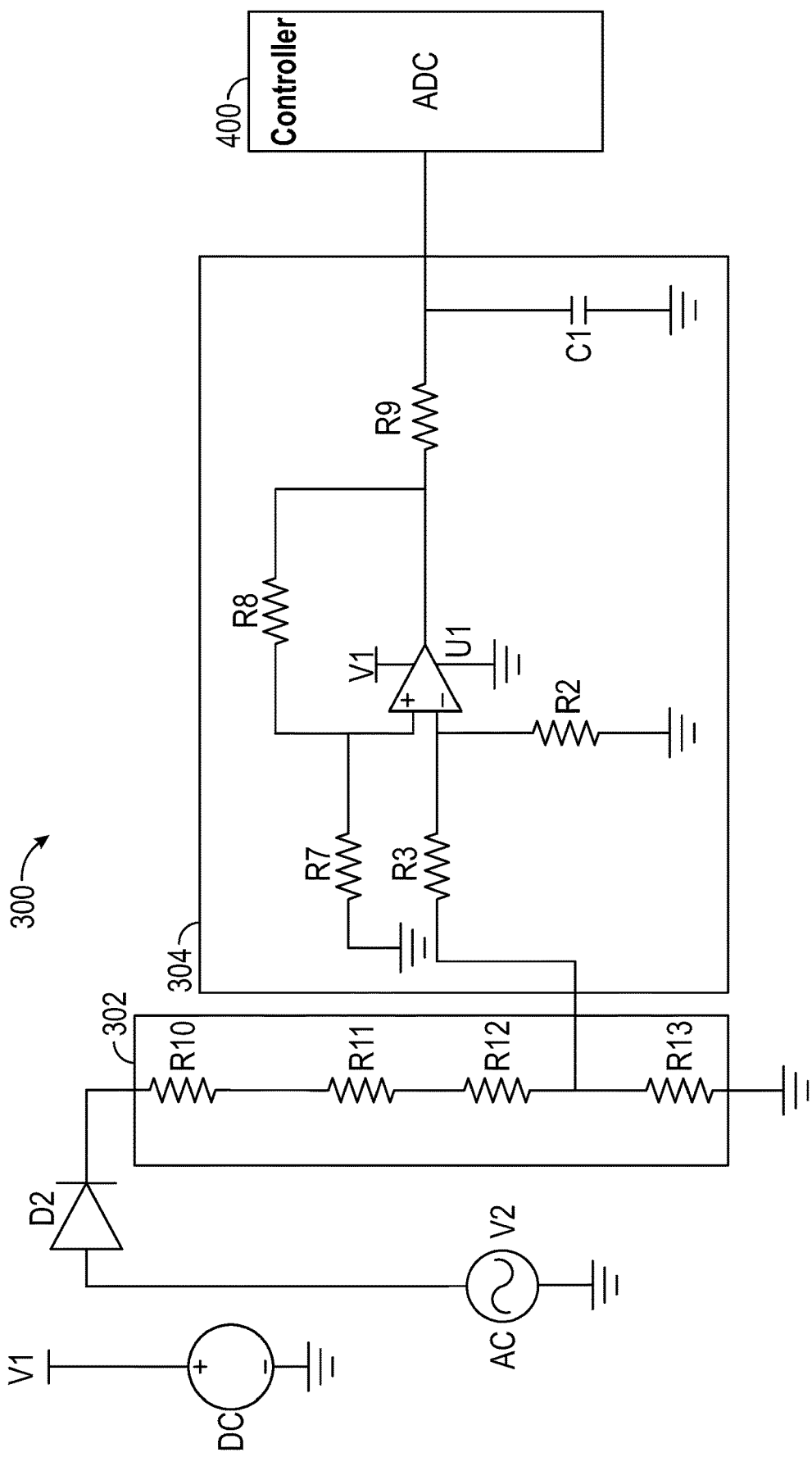
FIG. 5 is a schematic diagram of an example sensing circuit of an energy monitoring device in accordance with an example embodiment of the disclosed concept.

FIG. 4 is a block diagram of an example sensing circuit 300 of an energy monitoring device 1 in accordance with an example embodiment of the disclosed concept. FIG. 4 illustrates a main process under which a sensing circuit 300 may operate during energy monitoring in accordance with the present disclosure. The sensing circuit 300 may be, e.g., a temperature sense signal conditioning circuit 320, a hot voltage sense signal conditioning circuit 330, or a load voltage sense signal conditioning circuit 340. The sensing circuit 300 includes a voltage divider circuit 302 and a fixed gain differential amplifier 304. The sensing circuit 300 first measures the A/C voltage signal, e.g., 110V, 120V, 130V, 270V, etc. from a power source and converts the A/C voltage to a D/C voltage via a half bridge rectifier as shown in FIG. 5. The voltage divider circuit 302 then reduces the D/C voltage signal to a voltage level compatible to the operation voltage (e.g., up to 3.3 V, 5V, etc.) of the controller 400. Next, the fixed gain differential amplifier 304 amplifies the reduced voltage and transmits the amplified voltage to an ADC pin of the controller 400. For example, the hot voltage sense signal conditioning circuit 330 may measure the A/C hot voltage, e.g., 120V, which is too high for the controller operating with voltage up to, e.g., 3.3V, 5V, etc. The voltage divider circuit 302 of the hot voltage sense signal conditioning circuit 330 receives the D/C voltage converted from the A/C voltage via a half bridge rectifier and reduces the D/C voltage into a low voltage, e.g., 500 mV, compatible to the operating voltage of the controller 400. The fixed gain differential amplifier 304 may then amplify the output of the voltage divider circuit 302, e.g., 500 mV, in order to increase accuracy. The amplified voltage is then transmitted to the analog to digital converter (ADC) of the controller 400. In another example, the load voltage sense signal conditioning circuit 340 may measure the A/C load voltage, e.g., 119V. The voltage divider circuit 302 of the load voltage sense signal conditioning circuit 340 then reduces the D/C voltage into a low voltage, e.g., 500 mV, compatible to the operating voltage of the controller 400. The fixed gain differential amplifier 304 may then amplify the output of the voltage divider circuit 302, e.g., 500 mV, in order to increase accuracy. The amplified voltage is then transmitted to the ADC of the controller 400. The controller 400 may then determine the delta between the measured hot voltage and load voltage and calculate the load current using the delta and the relay contact resistance.

FIG. 5 is a schematic diagram of a sensing circuit 300 of an energy monitoring device 1 in accordance with an example embodiment of the disclosed concept. The sensing circuit 300 may be a temperature sense signal conditioning circuit 320, a hot voltage sense signal conditioning circuit 330, a load voltage sense signal conditioning circuit 340, etc. The sensing circuit 300 measures A/C voltage, e.g., hot voltage, load voltage, etc. A half bridge rectifier D2 converts the A/C voltage into the D/C voltage and transmits the D/C voltage to the voltage divider circuit 302 that in turn reduces the D/C voltage to a low voltage compatible to the operating voltage of the controller 400. The low voltage across R13 of the voltage divider circuit 302 is then transmitted to the fixed gain differential amplifier 304, which in turn amplifies the low voltage to increase accuracy. The amplified voltage becomes steadied by the capacitor C1 and the flat voltage at C1 is then transmitted to ADC of the controller 400.

Figure 6:
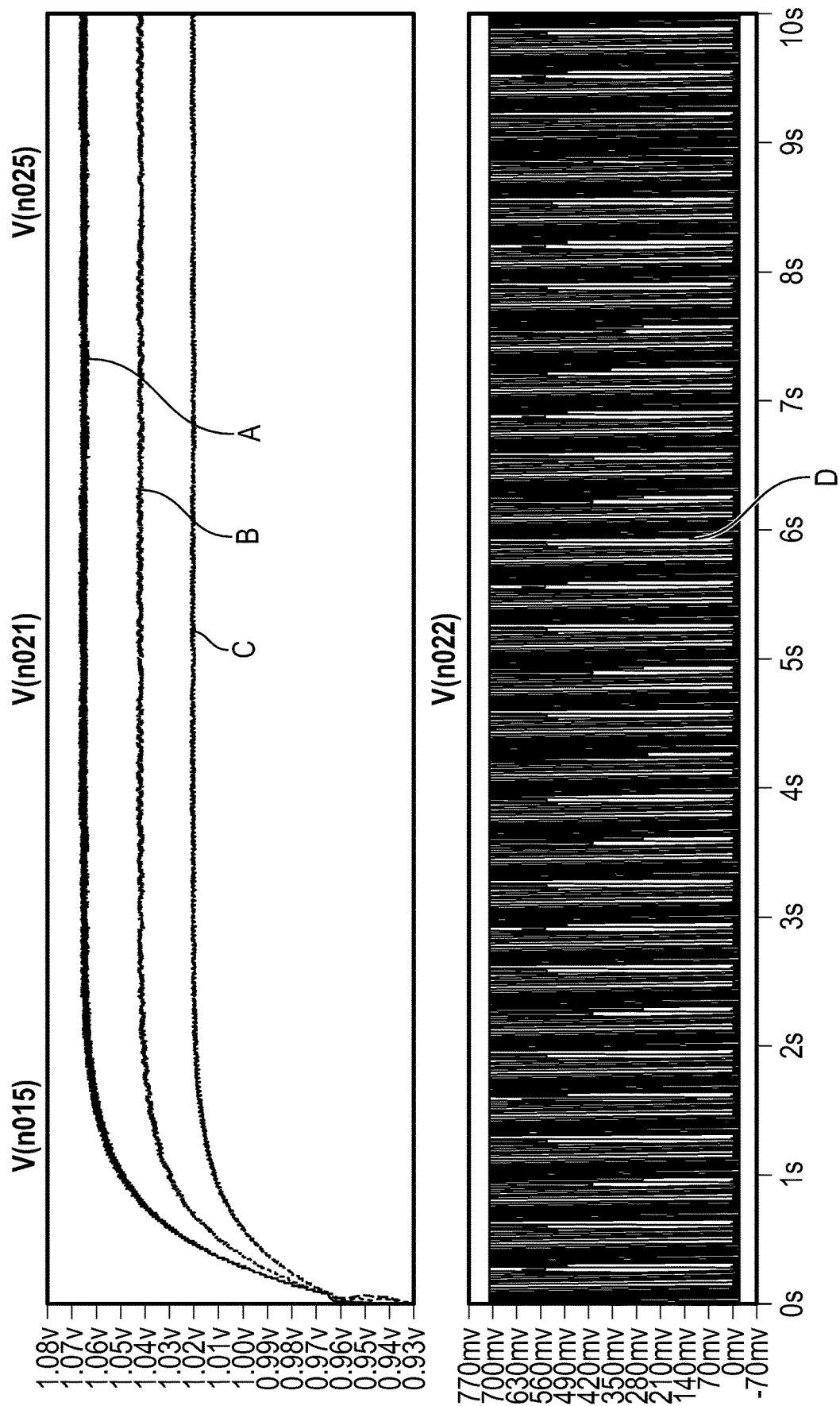
FIG. 6 illustrates waveforms showing simulation results of the sensing circuit of an energy monitoring device in accordance with an example embodiment of the disclosed concept.

FIG. 6 illustrates waveforms for voltage outputs to a controller 400 from a sensing circuit 300 of an energy monitoring device 1 in accordance with an example embodiment of the disclosed concept. FIG. 6 shows waveform A, a simulation result of the output of the sensing circuit 300 when the sensing circuit 300 measures 130 $V_{AC}$ at, e.g., a HOT conductor 12. Waveform C indicates the output of the sensing circuit 300 to the controller 400 is approximately 1.07 $V_{DC}$. Waveform B indicates a simulation result that the sensing circuit 300 outputs approximately 1.03 $V_{DC}$ to the controller 400 when the sensing circuit 300 measures 120 $V_{AC}$ at, e.g., a HOT conductor 12. Waveform C depicts a simulation result that the sensing circuit 300 outputs approximately 1.00 $V_{DC}$ to the controller 400 when the sensing circuit 300 measures 110 $V_{AC}$ at, e.g., a HOT conductor 12. Waveform D is a voltage divider waveform during simulations.

Figure 7:
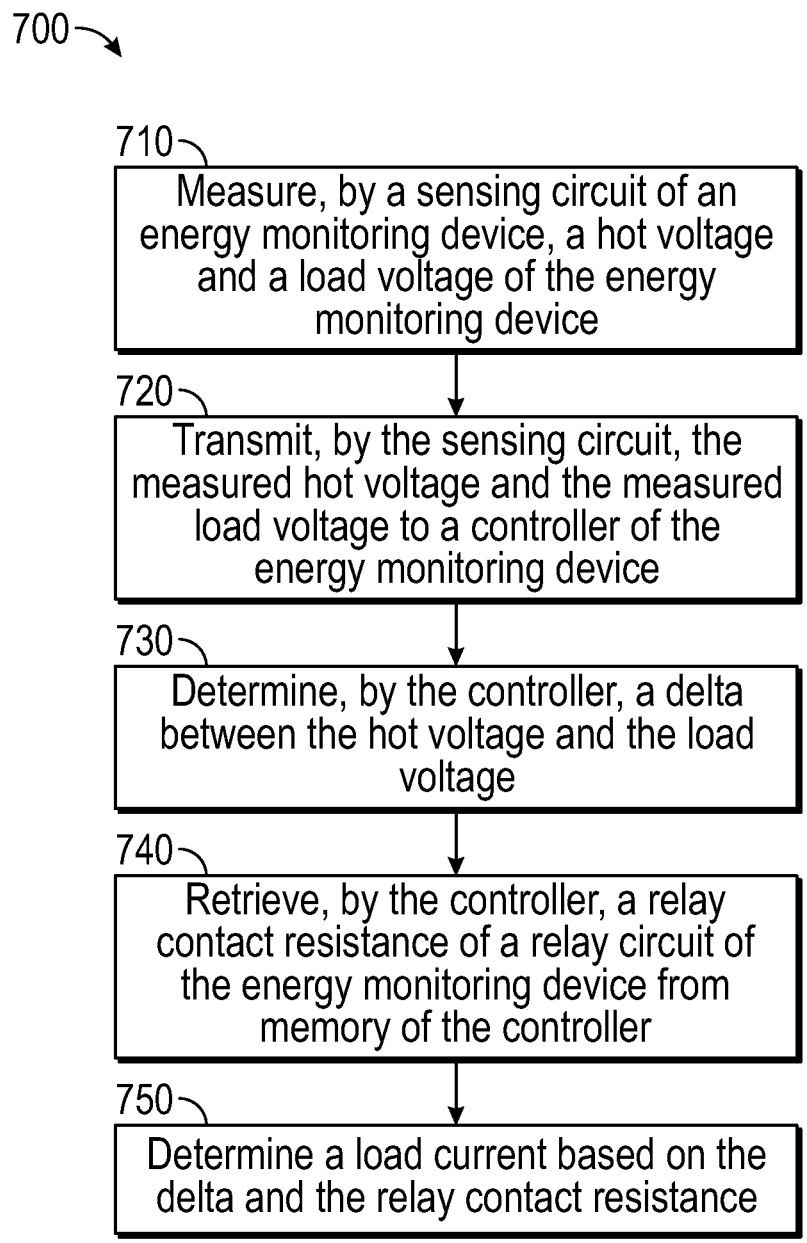
FIG. 7 is a flowchart for method for monitoring energy in accordance with an example embodiment of the disclosed concept.

FIG. 7 is a flowchart for method 700 for monitoring energy in accordance with an example embodiment of the disclosed concept. The method 700 may be performed by an energy monitoring device 1 or components therein as described with reference to FIGS. 1-3.

At 710, a sensing circuit 300 of the energy monitoring device 1 may measure a hot voltage and a load voltage of the energy monitoring device 1.

At 720, the sensing circuit 300 may transmit the measured hot voltage and the measured load voltage to a controller 400 of the energy monitoring device 1.

At 730, the controller 400 may determine a delta between the hot voltage and the load voltage.

At 740, the controller 400 may retrieve a relay contact resistance of a relay circuit of the energy monitoring device 1 from memory of the controller 400.

At 750, the controller may determine a load current based on the delta and the relay contact resistance.

Figure 8:
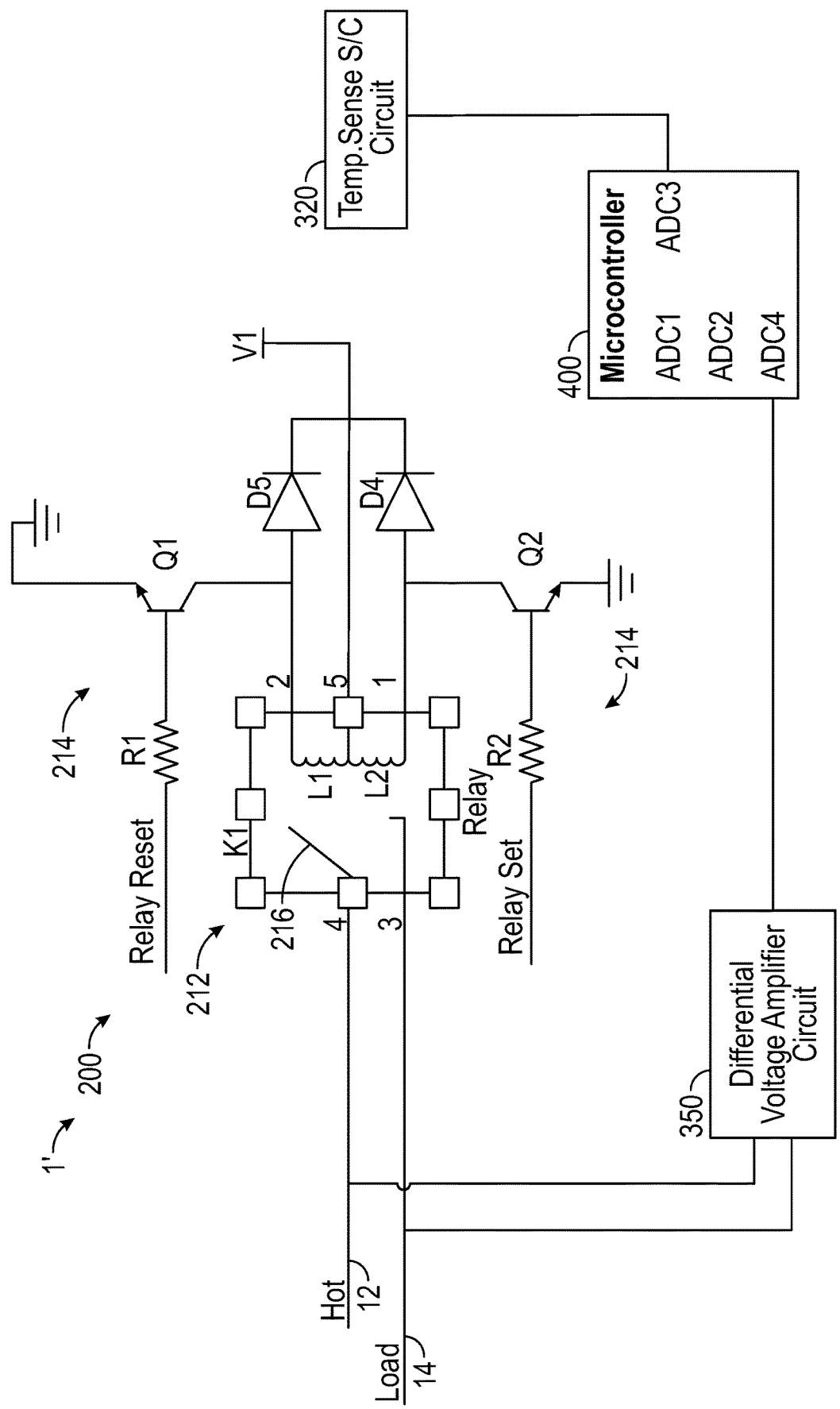
FIG. 8 is a schematic diagram of an energy monitoring device in accordance with an example embodiment of the disclosed concept.
Figure 9:
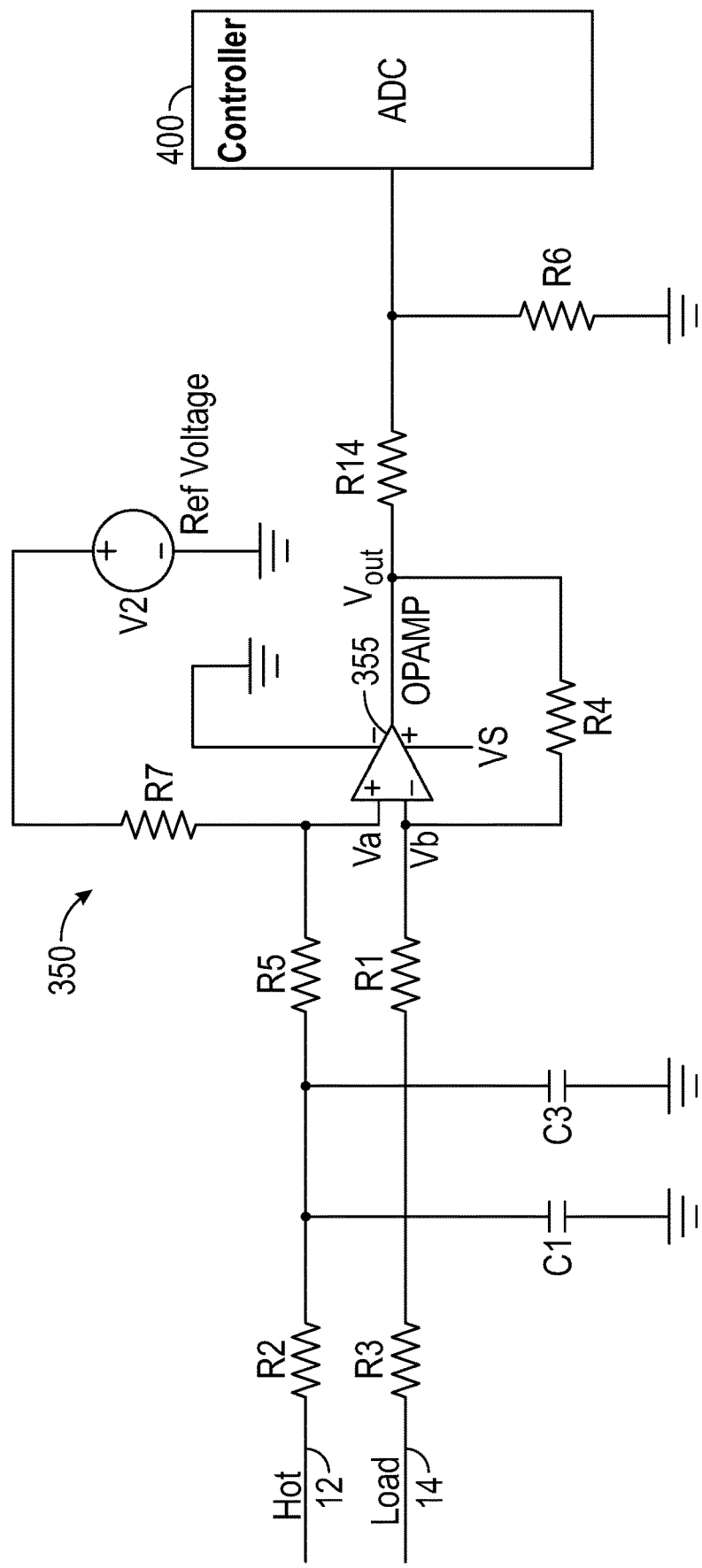
FIG. 9 is a schematic diagram of a differential voltage amplifier circuit in accordance with an example embodiment of the disclosed concept.

FIG. 8 is a schematic diagram of an energy monitoring device 1' in accordance with an example embodiment of the disclosed concept. The energy monitoring device 1' includes a power supply circuit 100 (not shown), a relay circuit 200, a sensing circuit including a temperature sense signal conditioning circuit 320 and a differential voltage amplifier circuit 350, and microcontroller 400. The power supply circuit 100 is the same as the power supply circuit 100 as described with reference to FIGS. 1 and 2, and thus the description of the power supply circuit 100 and its components thereof is omitted for brevity. The relay circuit 200 is coupled to HOT conductor 12 and LOAD conductor 14, and is the same relay circuit 200 as described with reference to FIGS. 1-3, and thus the description of the relay circuit 200 and components therein is omitted for brevity. The temperature sense signal conditioning circuit 320 is the same as the temperature sense signal conditioning circuit 320 as described with reference to FIG. 2, and thus, the description of the temperature sense signal conditioning circuit 320 and its components is also omitted for brevity. The differential voltage amplifier circuit 350 includes a differential operational amplifier (OPAMP) 355 (as shown in FIG. 9) coupled to the HOT conductor 12 and the LOAD conductor 14, and is structured to sense or measure the hot and load voltages, process and determine the delta between the voltage measured at the HOT conductor 12 and the voltage measured at the LOAD conductor 14. The differential voltage amplifier circuit 350 provides the delta between the measured hot and load voltages to the microcontroller 400 for relay current calculation. The microcontroller 400 is coupled to the differential voltage amplifier circuit 350 via an analog-to-digital converter pin (e.g., ADC 4), and receives the delta from the differential voltage amplifier circuit 350 and calculates load current using a relay contact resistance of the relay circuit 200 retrieved from memory and the delta between the measured hot voltage and the measured load voltage. Thus, the energy monitoring device 1' uses the differential voltage amplifier circuit 350 to sense the hot voltage and the load voltage, rather than using the hot voltage sense signal conditioning circuit 330 and the load voltage sense signal conditioning circuit 340 as described with reference to FIGS. 1-6, thereby further reducing the hardware components required for measuring the load current. Further, the differential voltage amplifier circuit 350 calculates the delta between the sensed or measured hot and load voltages and transmits the delta to the microcontroller 400, using only one ADC pin of the microcontroller 400. In addition, the microcontroller 400 needs no longer calculate the delta itself, freeing up its processing power and capabilities. Such reduction of required hardware components and processing power allows the embodiments using the energy monitoring device 1' in accordance with the present disclosure to further reduce costs and increase efficiency as compared to the embodiments using the hot voltage sense signal conditioning circuit 330 and the load voltage sense signal conditional circuit 340 for sensing the hot and load voltages.

FIG. 9 is a schematic diagram of a differential voltage amplifier circuit 350 in accordance with an example embodiment of the disclosed concept. The differential voltage amplifier circuit 350 is coupled to the HOT conductor 12 and the LOAD conductor 14, and includes a differential OPAMP 355, resistors R1, R2, R3, R4, R5, R6, R7, R14, capacitors C1, C3 and the D/C reference voltage source V2. The positive terminal of the differential OPAMP 355 is coupled to the HOT conductor 12 via resistors R2, R5 and the negative terminal of the differential OPAMP 355 is coupled to the LOAD conductor 14 via resistors R1, R3. Resistors R2, R3, R5, R1 act to prevent high voltage across the differential OPAMP 355. Capacitors C1, C3 are used to filter the noise from the input voltages (e.g., the hot voltage, the load voltage, etc.). Resistor R7 coupled to the D/C reference voltage source and the differential OPAMP 355 increases the D/C voltage level of the differential OPAMP 355. Resistor R4 sets the gain for the differential OPAMP 355. For example, resistor R4 may set the gain of unity, thereby rendering the Vout to be equal to the difference (e.g., the delta (Va–Vb)) between the sensed hot voltage at Va and the sensed load voltage at Vb. Then, the output terminal of the differential OPAMP 355 provides Vout representative of the delta between the sensed hot and load voltages to the microcontroller 400. Resistors R14, R6 act as a voltage divider to divide Vout and provide that voltage to an ADC pin of the microcontroller 400. The microcontroller 400 then calculates load current using a relay contact resistance of the relay circuit 200 retrieved from memory and the delta between the sensed hot voltage and load voltage.

Figure 10:
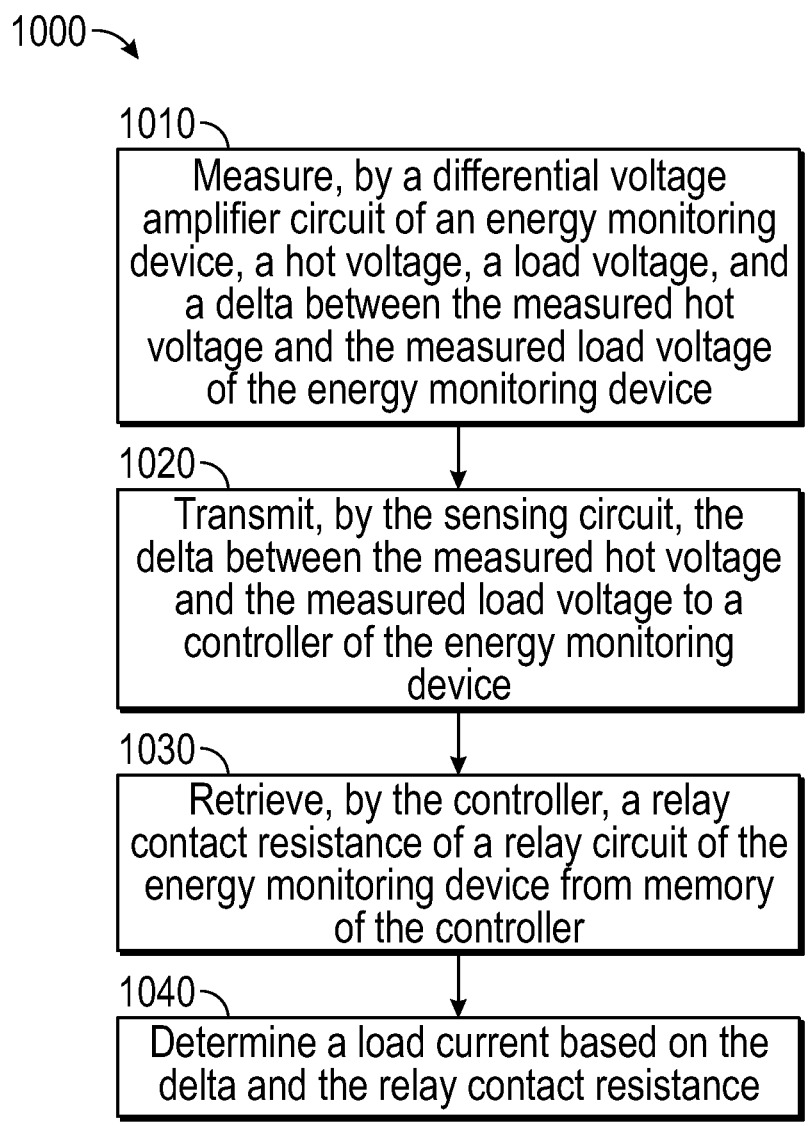
FIG. 10 is a flow chart for method for monitoring energy in accordance with an example embodiment of the disclosed concept.

FIG. 10 is a flow chart for method 1000 for monitoring energy in accordance with an example embodiment of the disclosed concept. The method 1000 may be performed by an energy monitoring device 1 or components therein as described with reference to FIGS. 1-3 and 7-8 in accordance with the present disclosure.

At 1010, a differential voltage amplifier circuit 350 of an energy monitoring device 1' measures a hot voltage, a load voltage, and a delta between the measured hot voltage and the measured load voltage of the energy monitoring device 1'.

At 1020, the differential voltage amplifier circuit 350 transmits the delta between the measured hot voltage and the measured load voltage to a controller of the energy monitoring device 1'.

At 1030, the controller 400 may retrieve a relay contact resistance of a relay circuit of the energy monitoring device 1' from memory of the controller 400.

At 1040, the controller 400 may determine a load current based on the delta and the relay contact resistance.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. An energy monitoring device comprising:
    a power supply circuit electrically coupled to a power source via a hot conductor and a load via a load conductor;
    a relay circuit comprising a relay and a relay driver circuit electrically coupled to the relay and configured to drive the relay, wherein the relay comprises a relay contact and a plurality of coils, and the relay contact is electrically coupled to the hot conductor and the load conductor;
    a sensing circuit comprising a hot voltage sensor electrically coupled to the power source and a load voltage sensor electrically coupled to the load conductor; and
    a controller comprising an analog to digital converter, and electrically coupled to the power supply circuit, the relay driver circuit, and the sensing circuit, wherein the controller is structured to receive a hot voltage from the hot voltage sensor and a load voltage from the load voltage sensor, and determine a load current based at least in part on a relay contact resistance of the relay contact and a delta between the hot voltage and the load voltage.

2. The energy monitoring device of claim 1, wherein the controller is structured to determine the delta based at least in part on the relay contact being closed.

3. The energy monitoring device of claim 1, wherein the plurality of coils comprises a first coil and a second coil, and the relay driver circuit comprises a first switch electrically couplable to the first coil and the power supply circuit and a second switch electrically couplable to the second coil and the power supply circuit.

4. The energy monitoring device of claim 3, wherein the relay contact is closed based on the first coil being energized by a voltage output from the power supply circuit via the first switch upon closing of the first switch.

5. The energy monitoring device of claim 4, wherein the relay contact is open based on the second coil being energized by the voltage output via the second switch upon closing of the second switch and opening of the first switch.

6. The energy monitoring device of claim 1, wherein the sensing circuit comprises a half bridge rectifier, a voltage divider, and a fixed gain differential amplifier.

7. The energy monitoring device of claim 6, wherein the sensing circuit transmits a voltage output from the fixed gain differential amplifier to the controller.

8. The energy monitoring device of claim 1, wherein the sensing circuit further comprises a temperature sensor electrically coupled to the controller and structured to transmit a voltage signal to the controller.

9. The energy monitoring device of claim 8, wherein the controller is structured to determine an instant ambient temperature based on the voltage signal in accordance with a look-up table stored in memory of the controller.

10. The energy monitoring device of claim 9, wherein the controller is further structured to adjust the relay contact resistance based on the determined ambient temperature and calculate the load current based on the delta and the adjusted relay contact resistance.

11. The energy monitoring device of claim 1, wherein the relay contact resistance is an average relay contact resistance.

12. The energy monitoring device of claim 11, wherein the controller is configured to obtain the average relay contact resistance by obtaining an average of a plurality of relay contact resistances measured upon passing a plurality of current via the relay contact.

13. The energy monitoring device of claim 12, wherein the plurality of current comprises at least a first current comprising a low current and a second current comprising a high current.

14. The energy monitoring device of claim 13, wherein the controller is configured to obtain a plurality of deltas between respective hot voltages and load voltages, including at least a first delta based on the first current and a second delta based on the second current.

15. The energy monitoring device of claim 14, wherein the plurality of relay contact resistance comprises at least a first relay contact resistance based on the first delta and the first current and a second relay contact resistance based on the second delta and the second current.

16. The energy monitoring device of claim 1, wherein the sensing circuit further comprises a zero crossing detector circuit.

17. An energy monitoring device comprising:
a power supply circuit electrically coupled to a power source via a hot conductor and a load via a load conductor;
a relay circuit comprising a relay and a relay driver circuit electrically coupled to the relay and configured to drive the relay, wherein the relay comprises a relay contact and a plurality of coils, and the relay contact is electrically coupled to the hot conductor and the load conductor;
a sensing circuit comprising a differential voltage amplifier circuit, wherein the differential voltage amplifier circuit comprises a differential operational amplifier (OPAMP), one input terminal of the OPAM is coupled to the power source and structured to receive hot voltage sensed at the hot conductor, the other input terminal of the OPAMP is coupled to the load and structured to receive load voltage sensed at the load conductor, and the output terminal of the OPAMP is structured to provide a voltage output representative of a delta between the hot voltage and the load voltage; and
a controller comprising an analog to digital converter, and electrically coupled to the power supply circuit, the relay driver circuit, and the sensing circuit, wherein the controller is structured to receive the delta between the hot voltage and the load voltage from the differential voltage amplifier circuit, and determine a load current based at least in part on a relay contact resistance of the relay contact and the delta.

18. A method for energy monitoring, comprising:
measuring, by a sensing circuit of an energy monitoring device, a hot voltage and a load voltage of an energy monitoring device;
transmitting, by the sensing circuit, the measured hot voltage and the measured load voltage to a controller of the energy monitoring device;
determining, by the controller, a delta between the hot voltage and the load voltage;
retrieving, by the controller, a relay contact resistance from memory of the controller; and
determining a load current based on the delta and the relay contact resistance.

19. The method of claim 18, further comprising adjusting the relay contact resistance based on an instant ambient temperature determined based on a voltage signal received from a temperature sensor.

20. The method of claim 19, wherein the load current is determined based on the delta and the adjusted relay contact resistance.

* * * * *